(12) United States Patent
Chang et al.

(10) Patent No.: US 9,348,748 B2
(45) Date of Patent: May 24, 2016

(54) HEAL LEVELING

(71) Applicant: MACRONIX INTERNATIONAL CO., LTD., Hsinchu (TW)

(72) Inventors: Yu-Ming Chang, Pingtung (TW); Hsiang-Pang Li, Hsinchu (TW); Hang-Ting Lue, Hsinchu (TW); Yuan-Hao Chang, Taipei (TW); Tei-Wei Kuo, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 22 days.

(21) Appl. No.: 14/578,820

(22) Filed: Dec. 22, 2014

(65) Prior Publication Data
US 2015/0177996 A1    Jun. 25, 2015

Related U.S. Application Data

(60) Provisional application No. 61/920,488, filed on Dec. 24, 2013.

(51) Int. Cl.
*G06F 12/00* (2006.01)
*G06F 12/02* (2006.01)
(Continued)

(52) U.S. Cl.
CPC ............ *G06F 12/0246* (2013.01); *G06F 12/00* (2013.01); *G11C 16/3495* (2013.01); *G11C 29/4401* (2013.01); *G06F 2212/1036* (2013.01); *G06F 2212/7211* (2013.01)

(58) Field of Classification Search
CPC ............... G06F 12/0246; G06F 2212/1036; G06F 2212/7211; G11C 16/3495; G11C 29/4401
See application file for complete search history.

(56) References Cited

U.S. PATENT DOCUMENTS 6,009,033 A    12/1999    Li et al.
6,251,717 B1    6/2001    Ramsbey et al.
(Continued)

FOREIGN PATENT DOCUMENTS

EP    2048709 A2    4/2009
WO    2011022123 A1    2/2011

OTHER PUBLICATIONS

Mielke N. et al., "Flash EEPROM Threshold Instabilities due to Charge Trapping During Program/Erase Cycling," IEEE Trans. on Device and MaterialsReliability, vol. 4, No. 3, Sep. 2004, pp. 335-344.

(Continued)

*Primary Examiner* — Kevin Verbrugge
*Assistant Examiner* — Alan Otto
(74) *Attorney, Agent, or Firm* — Haynes Beffel & Wolfeld LLP

(57) ABSTRACT

Technology is described that increases endurance of memory devices through heal leveling. Heal leveling is a lightweight solution to distribute healing cycles among memory blocks. Approaches described herein can accomplish heal leveling without introducing a large amount of overhead. Heal leveling significantly improves the access performance and the effective lifetime of memory blocks. By more evenly distributing the heal count it may not be necessary to directly apply wear leveling based on access counts of each block because each block will be more evenly accessed in the long run. Heal leveling may be performed by moving data that is seldom or never modified after creation, such as read-only files, to blocks having suffered the greatest number, or a high number, of healing cycles.

24 Claims, 6 Drawing Sheets

(51) Int. Cl.
*G11C 29/44* (2006.01)
*G11C 16/34* (2006.01)

(56) References Cited

U.S. PATENT DOCUMENTS

| | | | |
|---|---|---|---|
| 7,260,758 B1* | 8/2007 | Agrawal | G11C 29/56 714/733 |
| 7,301,818 B2 | 11/2007 | Lu et al. | |
| 7,315,474 B2 | 1/2008 | Lue | |
| 7,382,654 B2 | 6/2008 | Hsu et al. | |
| 7,626,228 B2 | 12/2009 | Park et al. | |
| 7,704,847 B2 | 4/2010 | Cannon et al. | |
| 7,709,334 B2 | 5/2010 | Lai et al. | |
| 8,085,615 B2 | 12/2011 | Taguchi | |
| 8,138,573 B2 | 3/2012 | Cannon et al. | |
| 8,193,573 B2 | 6/2012 | Bronner et al. | |
| 8,247,862 B2 | 8/2012 | Babcock et al. | |
| 8,344,475 B2 | 1/2013 | Shaeffer et al. | |
| 8,488,387 B2 | 7/2013 | Lue et al. | |
| 8,612,669 B1 | 12/2013 | Syu et al. | |
| 2007/0150689 A1 | 6/2007 | Pandit et al. | |
| 2007/0208904 A1 | 9/2007 | Hsieh et al. | |
| 2007/0294490 A1 | 12/2007 | Freitas et al. | |
| 2009/0039414 A1 | 2/2009 | Lue et al. | |
| 2009/0254729 A1 | 10/2009 | Lin et al. | |
| 2009/0276470 A1 | 11/2009 | Vijayarajan et al. | |
| 2010/0025811 A1 | 2/2010 | Bronner et al. | |
| 2010/0246235 A1 | 9/2010 | Gouin | |
| 2011/0055458 A1 | 3/2011 | Kuehne | |
| 2011/0238892 A1* | 9/2011 | Tsai | G11C 16/349 711/103 |
| 2012/0297123 A1 | 11/2012 | Cherubini et al. | |
| 2013/0326148 A1 | 12/2013 | Fang et al. | |
| 2015/0255175 A1* | 9/2015 | Hyder | G11C 29/42 714/719 |

OTHER PUBLICATIONS

Lee J-D et al., "Effects of Interface Trap Generation and Annihilation on the Data Retention Characteristics of Flash Memory Cells," IEEE Trans. on Device and Materials Reliability, vol. 4, No. 1, Mar. 2004, pp. 110-117.

Wu Q et al., "A First Study on Self-Healing Solid-State Drives," IEEE Int'l Memory Workshop (IMW), May 2011, 4 pp.

Extended EP Search Report in related application mailed Sep. 20, 2012, 3 pp.

Lue H-T et al., "Scaling Evaluation of BE-SONOS NAND Flash Beyond 20 nm," VLSI Synmposia on Technology, Honolulu HI, 2008, pp. 116-117.

Lue H-T et al., "BE-SONOS: A Bandgap Engineered SONOS with Excellent Performance and Reliability," IEDM Tech. Dig. 2005, pp. 547-550. Hang-Ting Lue; Szu-Yu Wang; Erh-Kun Lai; Yen-Hao Shih; Sheng-Chih Lai; Ling-Wu Yang; Kuang-Chao Chen; Ku, J.;Kuang-Yeu Hsieh; Rich Liu; Chih-Yuan Lu; , "BE-SONOS: A bandgap engineered SONOS with excellent performance and reliability," Electron Devices Meeting, 2005. IEDM Technical Digest. IEEE International , vol., No., pp. 547-550, Dec. 5, 2005. cited byapplicant.

Shin Y. et al., "A Novel NAND-type MONOS Memory using 63nm Process Technology for Multi-Gigabit Flash EEPROMs," IEEE IEDM Tech. Digest, 2005, pp. 327-330.

Shin Y. et al., "High Reliable SONOS-type NAND Flash Memory Cell with Al2O3 for Top Oxide," 19th Non-Volatile Semiconductor Memory Workshop, IEEE, Monterey CA, 2003, pp. 58-59. wdx 158737.

\* cited by examiner (a) Module Implementation (b) Layer Implementation

HEAL LEVELING

RELATED APPLICATIONS

Benefit is claimed of U.S. Provisional Patent Application No. 61/920,488 filed on 24 Dec. 2013, which application is incorporated by reference as if fully set forth herein.

TECHNICAL FIELD

The present disclosure relates to memory devices and systems including memory management.

DESCRIPTION OF RELATED ART

Some types of nonvolatile memory, for example flash memory based on charge trapping, and phase change memory, can have access cycle endurance limitations, in the form of program/erase cycle or set/reset cycle endurance limitations.

The access cycling applied to a given block of memory can be a function of the data stored in the block. As a result, different parts of a memory tend to reach the endurance limitations at different times. To address this issue, technology often referred to as "wear leveling" has been developed. Basically, wear leveling involves moving the data stored in a memory from block to block based on, for flash memory, program and erase cycling of the blocks. Actively used data can be moved out of blocks that are approaching their endurance limits, into less used blocks. This movement of the data can be made transparent to the application programs using the data, using logical addressing schemes. Even with wear leveling technologies, the endurance of the memory can remain a limitation on use in some high data traffic applications.

Technologies have also been developed to repair memory cells which have suffered a number of accesses that include program/erase cycles or set/reset cycles. Some types of access cycles, such as read cycles, may not be counted in the wear leveling processes. With these repair processes, the endurance of the memory blocks can be extended. For example, in charge trapping flash memory and in other types of nonvolatile memory, thermal cycling can be used to repair, or heal, damaged memory cells, and thereby improve the endurance of the memory device. See for example U.S. Pat. No. 8,488,387, assigned to Macronix International Co, Ltd. Similar thermal cycling can also be applied in other memory technologies.

While the healing operations can recover/repair the memory cells to a certain degree, in some technologies the procedure cannot be applied an unlimited number of times. The effectiveness of the heal process for example can be reduced as it is repeated on a given block of memory.

It is desirable to provide a technology addressing the issues of endurance for memory that takes advantage of the healing process. It is also desirable to prevent blocks from being excessively erased or healed with minimized overhead.

SUMMARY

Technology is described that increases endurance of memory devices through heal leveling. Heal leveling is a logical process to distribute healing cycles among memory blocks. Approaches described herein can accomplish heal leveling without introducing a large amount of overhead. Heal leveling significantly improves the access performance and the effective lifetime of memory blocks. By more evenly distributing the heal count it may not be necessary to directly apply wear leveling based on access counts of each block because each block will be more evenly accessed in the long run. Heal leveling may be performed by moving data that is seldom or never modified after creation, such as read-only files, to blocks having suffered the greatest number, or a high number, of healing cycles.

Heal leveling technology implements issuing a heal command to initiate a healing operation to recover or repair damaged memory blocks. The heal-leveling technology minimizes the variation in the numbers of healing cycles among all memory blocks as compared to actively minimizing the variation in block access as is done in wear-leveling. In embodiments, the healing command is issued to initiate a healing operation to a memory block at the time when the block reaches a limit of access cycles, such as a threshold number of erase cycles or reset cycles. In embodiments, the healing command may be issued to initiate a healing operation to a memory block in response to detecting the bit error rate, BER, of a block has reached a predetermined BER threshold. Further, in embodiments, a healing command may be issued in response to a user command or in response to elapsed time since a significant event, such as a system reboot or the most recent healing operation to the memory block, reaching a predetermined time threshold.

In the technology disclosed, the heal count of a block is the number of healing operations/cycles applied to the block. The access count of a block indicates the number of access cycles, of at least one type relevant to endurance of the memory block, that the block has endured after it was last healed. An example of an access cycle is an erase cycle for flash memory. In embodiments, an access count used in the heal leveling operation for a block indicates the number of access cycles that the block has endured after it was last healed. In embodiments, maintaining and storing of the heal count and access count of each block is done in an array.

A system incorporating heal-leveling technology can include logic for heal-leveling that distributes the healing cycles among memory blocks so as to ultimately improve the endurance, and therefore extend the lifetime, of memory blocks without introducing a large amount of overhead. The logic for heal-leveling may be implemented by hardware, software or a combination thereof.

In embodiments, heal leveling is accomplished by identifying non-over-threshold heal count blocks containing seldom modified data and moving the data to recently erased over-threshold heal count blocks. This process reduces the likelihood that the over-threshold heal count blocks will reach access count thresholds that indicate further heal cycles.

Other aspects and advantages of the present technology can be seen on review of the drawings, the detailed description and the claims, which follow.

DETAILED DESCRIPTION

A detailed description of embodiments of heal leveling is provided with reference to the Figures.

Figure 1A:
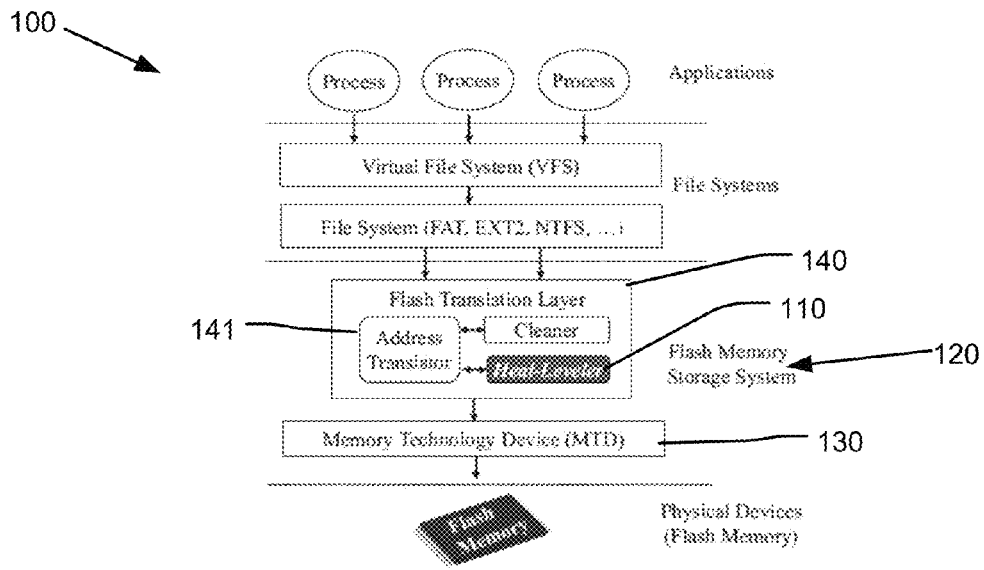
FIGS. 1A and 1B illustrate system architectures for the technology disclosed.
Figure 1B:
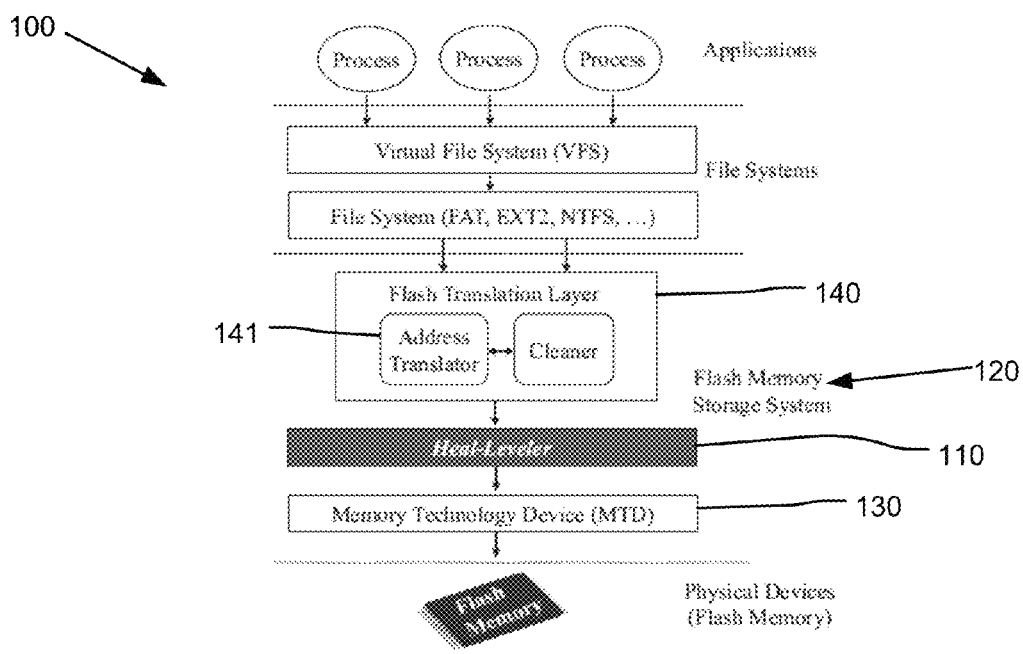

FIGS. 1A and 1B show examples of two system architectures 100 each including heal leveling technology in the form of a heal-leveler module 110 which executes heal leveling logic for flash memory. Other embodiments can be adapted for other types of memory. A memory storage system, in the example shown a flash memory storage system 120, may consist of two software layers to control memory chips. One layer is the memory technology device layer (MTD) 130 that is a hardware abstraction layer to provide primitive functions for the flash translation layer to access the underlying flash chips. The other layer is the flash translation layer 140 that may include an address translator 141, a garbage collector, and a wear leveler. The address translator 141 is to translate requested logical block addresses (LBAs) to corresponding physical flash blocks and pages. The garbage collector is to reclaim the space of invalid data due to the write-once property and out-place update features of some forms of memory, for example flash memory. The wear leveler is to evenly distribute erases to each block so as to extend the lifetime of memory chips. In embodiments, the disclosed heal leveling technology is integrated into existing system architectures of various types of memory chips. In embodiments, the heal-leveler module 110 is integrated into the flash translation layer 140, as shown in FIG. 1A. In embodiments, the heal-leveler module 110 is inserted between the flash translation layer 140 and the memory technology device layer 130, as shown in FIG. 1B and can be used with, or even replace, a wear leveler for extending the lifetime of the flash memory.

An important aspect of heal leveling technology is searching for and identify dormant data. Dormant data is identifiable by a metric implemented in the control logic, and can include data that has been located on the same memory block and not updated for a long time relative to the amount of time other data has been stored on other blocks. Identifying dormant data can be accomplished in different ways. For example, dormant data may be identified using healing lists with a certain observation period. In embodiments, heal leveling technology is composed of two procedures, referred to heuristically as an adjustment procedure and a freeze procedure. Together the two procedures manipulate a data structure in the form of healing lists. The adjustment procedure efficiently searches for and identifies blocks storing dormant data as defined by a metric such as the least recently erased block in a given heal count list. In embodiments, identifying blocks storing dormant data is done by moving recently cleared or erased blocks to the heads of healing lists which aggregates blocks containing dormant data to the tails of healing lists. In embodiments, the adjustment procedure is activated each time a block is erased. The adjustment procedure manipulates the structure and composition of the healing lists to identify the blocks that contain dormant data without copying any live data through a process of searching and selecting the least recently cleared block of a healing list containing non-over-threshold heal count blocks (where a "cleared block" is a block that has been erased or reset, or otherwise indicated to be available for use).

The freeze procedure controls the evenness of the heal counts of each block. The freeze procedure is invoked by the adjustment procedure when an over-threshold heal count block is accessed, for example accessed to be cleared or erased. An over-threshold heal count block is one that has reached or exceeded a heal count threshold. In embodiments, the heal count threshold is determined by the least amount of heal counts any of the memory blocks have and the number of healing lists.

The healing list(s) containing over-threshold heal count blocks may be referred to heuristically as the danger group, and the healing lists containing non-over-threshold heal count blocks may be referred to heuristically as the safety group. Embodiments of heal leveling technology maintain the safety group and the danger group so that blocks with a heal count over a threshold are considered to be closer to reaching an endurance limit than other blocks and therefore belong to the danger group, and blocks with a heal count under a threshold are considered not as close to reaching an endurance limit as the blocks in the danger group and therefore belong to a safety group.

Each time the freeze procedure is invoked, dormant data identified by the adjustment procedure is transferred to the recently erased over-threshold heal count block in the danger group. Transferring dormant data to the over-threshold heal count block significantly decreases the probability that the over-healed block will be erased and healed again in the near future because the block now contains dormant data that has a lesser likelihood of being rewritten than other memory blocks.

Figure 2:
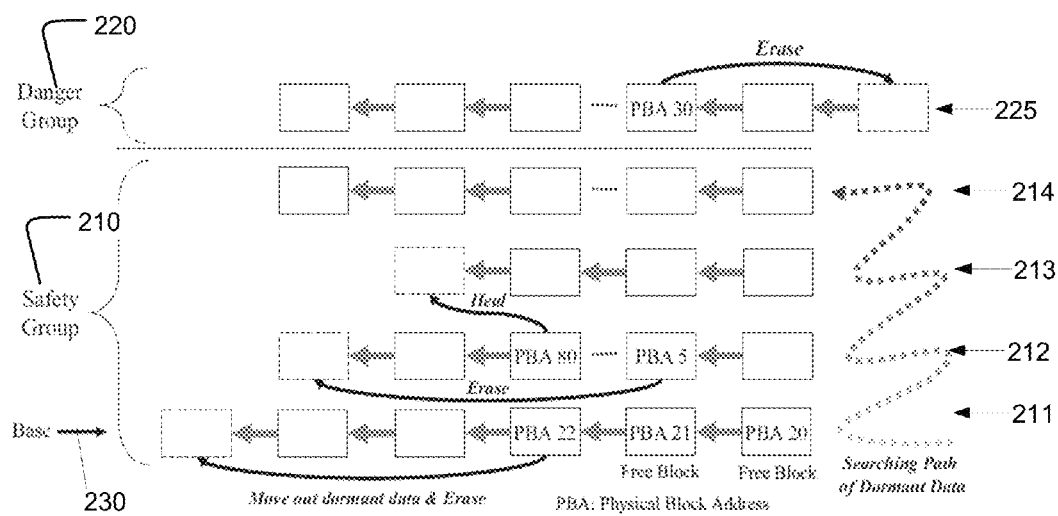
FIG. 2 illustrates an example of a data structure for the technology disclosed.

FIG. 2 shows an illustration of a data structure used in embodiments of the disclosed heal-leveling technology. The blocks are partitioned into two groups, labeled heuristically a safety group 210 and a danger group 220 as discussed above. The blocks in the safety group 210 can be arbitrarily erased and used to store any kind of data since they do not have as high of risk of reaching an endurance limit as the blocks in the danger group 220. Conversely, the blocks in the danger group 220 should not be arbitrarily erased and used to store any kind of data because they have each already been erased more times, and therefore been healed more times, than the blocks in the safety group 210. In embodiments, the blocks in the safety group 210 are linked to one of multiple healing lists 211, 212, 213, 214 that are part of the safety group 210, and all the blocks in the danger group 220 are linked to the one healing list 225. The safety group 210 and danger group 220 may contain any number of healing lists. In the example embodiment shown there are 5 total healing lists 211, 212, 213, 214, 225, four in the safety group 210 and one in the danger group 220. Each healing list can be a linked list ordered in this example from the most-recently-erased block at the head of the list, shown on the left side of the list in FIG. 2, to the least-recently-erased block at the tail of the list, shown on the right side of the list in FIG. 2. This order can be maintained by the adjustment procedure which moves recently erased blocks to the heads of healing lists after they are erased. Therefore the adjustment procedure identifies dormant data by aggregating the least recently-erased blocks to toward the tails of healing lists.

In embodiments, the blocks in the same healing list have the same or similar heal counts. In embodiments, all blocks with the same heal count are located in the same healing list. In embodiments, the data structure includes a base pointer 230 which points to the healing list whose corresponding blocks have the minimum heal count(s) among all the blocks in the system, the bottom healing list 211 in the example shown in FIG. 2. The base pointer 230 may point to any of the healing lists, and therefore any of the healing lists may correspond to the blocks having the minimum heal count(s) among the blocks in the system. In embodiments, prior to any memory block being healed, all the memory blocks have the same heal count of zero, and all the memory blocks belong to the healing list pointed to by the base pointer, and the other healing lists are empty.

In embodiments, the data structure may include any number of healing lists. The number of healing lists limits the tolerated difference of the heal counts among the blocks in the system. For example, FIG. 2 shows a safety group composed of 4 healing lists 211, 212, 213, 214, and the bottom healing list 211 is pointed to by the base pointer 230 because all the blocks in the bottom healing list have the lowest heal count of all the blocks. In this example, the healing list 212 above the bottom healing list 211 contains all blocks having a heal count one greater than the heal count of the blocks in the healing list pointed to by the base pointer. Each healing list may contain all blocks with heal counts one greater than the previous list, and therefore in this example the healing list 225 in the danger group contains blocks with four, or greater, heal counts more than the heal counts of the blocks in the healing list 211 pointed to by the base pointer.

In embodiments, healing lists are used to identify dormant data through the use of the adjustment procedure. During the freeze procedure, the identified dormant data is moved to recently erased blocks in the danger group, so that over-threshold heal count blocks, which are located in the danger group, will have a reduced likelihood of being erased or healed in the near future relative to blocks in the safety group. The heal count of the blocks in the danger group is unlikely to increase because these blocks are unlikely to be erased multiple times because dormant data is transferred into the blocks whenever the blocks are erased. Therefore differences in heal counts among the blocks in the system will depend on the amount of healing lists.

In embodiments, performance can be improved by organizing the healing lists. Blocks may be classified as belonging to a healing listed based on heal count. The processes of maintaining the healing lists and of searching for some specific block in the healing lists, can be facilitated using an array allocated with the number of elements equal to the number of blocks in the system. Each array element includes one index to indicate its corresponding healing list and two pointers to form doubly linked lists. For example, the linked-list status of each block i in the healing list can be maintained and directly derived in the element i of the array without any search cost. In embodiments where RAM space consumption is a critical issue, the array can be partitioned into equal sized chunks, and each chunk can be stored on memory and loaded to RAM in an on-demand fashion.

Figure 3:
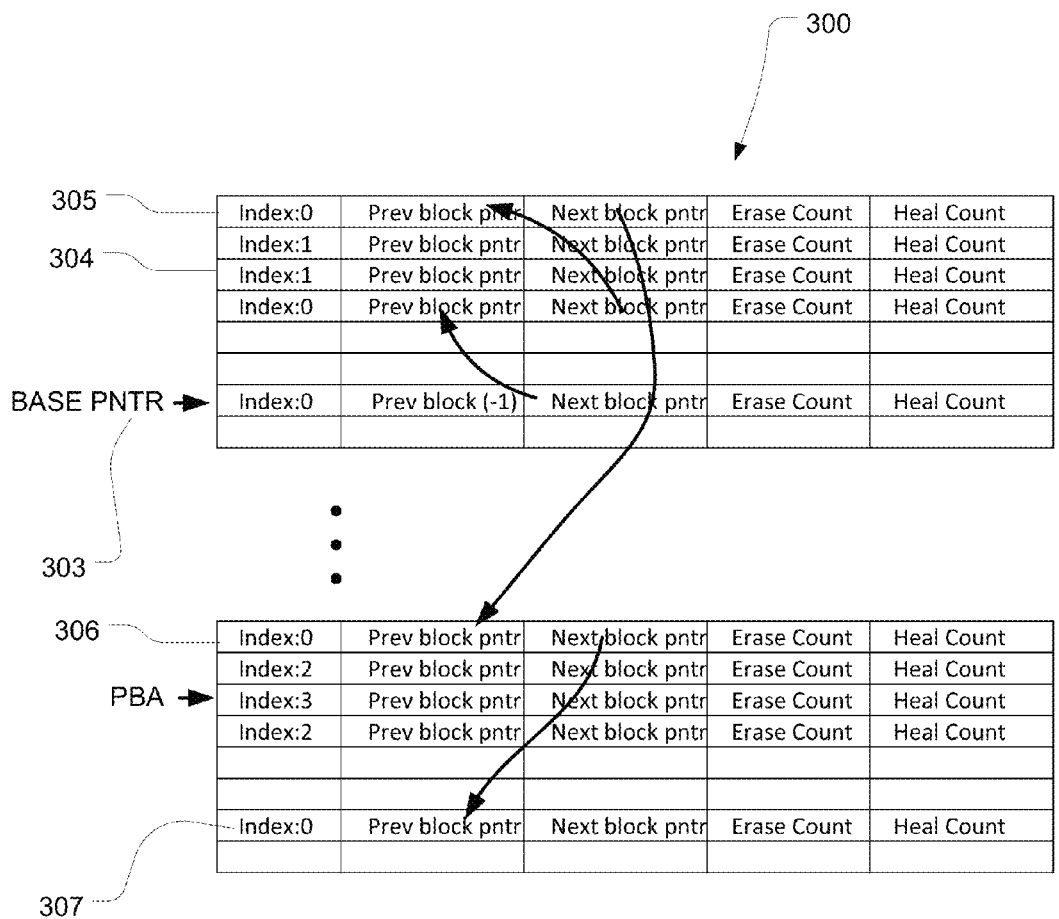
FIG. 3 illustrates an example of array element of a data structure for the technology disclosed.

FIG. 3 illustrates an array structure 300 which can be used in support of a heal leveling program. The array can be stored in a high speed memory, such as RAM, which is accessible by the computer executing the heal leveling program. Entries, such as entry 301 in the array structure 300, can include a number of data fields, including a field indicating the index (index:) used for the purposes of identifying the list (base list, a safety group list, a danger group list) of which the corresponding physical block is a member. A field including a previous block pointer (Prev. block pntr) and the field containing a next block pointer (Next block pntr) can be included for the purposes of establishing the doubly linked list for a given index. The pointers utilized can be address offsets or the complete physical block address of the next and previous blocks in the list. An entry that is at the head of the lowest heal count linked list, can store a previous block pointer having a default value such as the −1 indicated in the entry pointed to by the base pointer BASE PNTR 303. The entries in the array structure 300 can also be used for maintaining an erase count (or other access count) for the corresponding physical block, and for embodiments that might utilize it, a heal count.

An entry in the array structure 300 can be accessed using the physical block address (e.g. PBA 302) of the corresponding block in the memory subject of heal leveling. Thus when an erase, or other relevant access, is detected for a given physical block, the physical block address of the access is used to retrieve the entry corresponding to that physical block. The information stored in the entry, can be used in support of the heal leveling process as described above.

The heal leveling process in the example described above maintains a base pointer 303, which can be stored in a register or other memory location accessible by the computer executing the heal leveling program. The base pointer 303 can include the physical block address of the entry at the head of the list indicated by the index number of the safety list.

A search starting with the base pointer is illustrated by the arrows in the diagram, where a next block pointer in the entry accessed by the base pointer 303 points to entry 304 which has a matching previous block pointer. The next block pointer in the entry 304 points to the entry 305. The next block pointer in entry 305 points to the entry 306. The next block pointer in the entry 306 points to the entry 307, and so on. The doubly linked list can be traversed in the opposite direction as well. The head of a list having the next index can be identified (for example) by the next block pointer of the end of the lower index list, and by the index number stored in the entry.

When an entry is moved from one list to a next list, after it is subjected to a heal process for example, its index number is changed, and its previous block pointer and next block pointer are updated so that the entry is inserted in the proper location within the linked list associated with the new list. The previous block pointer of the block previously pointed to by the block's next block pointer and the next block pointer of the block previously pointed to by the block's previously block pointer are also updated. Also, the erase count and heal count values can be updated as appropriate, in response to erase and heal cycles on the memory. In embodiments, when a block in the system is subject to an erase cycle or access cycle, the adjustment procedure is activated to maintain or adjust the healing lists so as to let dormant data aggregate toward the end of the healing list corresponding to the lowest amount of heal counts, which is pointed to by the base pointer. When the adjustment procedure is invoked after a block is erased, the erased block's position in the healing lists is moved to the head of its corresponding healing list if the block has not reached its erase count limit, as shown in Block 5, labeled as PBA 5 in FIG. 2. If the erased block has reached its current erase count threshold, the erased block is healed, with a healing operation, and promoted to the head of the healing list corresponding to blocks with the same heal count as the recently healed block, as shown for Block 80, labeled PBA 80, of FIG. 2. In embodiments, if the bit error rate of the erased block has reached a bit error rate threshold, the erased block is healed, with a healing operation. The adjustment procedure therefore maintains the healing list by moving erased and healed blocks to the healing list with the same corresponding heal count. By moving erased blocks to the heads of a healing list, the tail end of each healing list corresponds to the least recently erased block in the respective healing list. Therefore the data located on the blocks in the tail end of the healing list is data with a low likelihood of being erased and is therefore data that is desirable to be moved to blocks where reducing the likelihood of being erased is beneficial.

In embodiments, if there are N healing lists in the system, the first N−1 healing lists will contain non-over-threshold heal count blocks and will therefore be considered the safety group, and the Nth healing list (i.e., healing list N−1) will contain over-threshold heal count blocks and will therefore be considered the danger group. When a block in healing list i is healed by a healing command, this block is promoted to the head of the healing list (i+1)% N when healing list i does not belong to the danger group. However, if a block in the danger group is erased, the freeze procedure is activated to move dormant data located in the safety group into the erased block in the danger group so as to reduce the likelihood of this block in the danger group from being erased or healed in the near future.

In embodiments, after the freeze procedure is invoked, a search process for dormant data initiates starting from the tail end of the healing list with the lowest corresponding heal count, which is pointed to by the base pointer. The first non-free block from the tail end of the healing list pointed to by the base pointer contains dormant data due to the adjustment procedure aggregating dormant data toward this position. The dormant data in the identified block is moved to the erased block in the danger group, followed by erasing the block, which contained the dormant data, and moving the block previously containing the dormant data to the head of its corresponding healing list if it has not reached its erase count limit.

An example of the freeze procedure is shown in FIG. 2. Block 30, labeled PBA 30, in the danger group 220 is erased and the freeze procedure is activated to search for the first non-free block, in this example Block 22, labeled PBA 22, from the healing list 211 pointed to by the base pointer 230. The dormant data in Block 22 is copied to Block 30, followed by erasing Block 22 and moving Block 22 to the head of its corresponding healing list 211, since it has not reached its erase count threshold. Block 30 is moved to the end of the healing list of the danger group because it is now storing the dormant data and it is not likely it will be erased in the near future.

Figure 4:
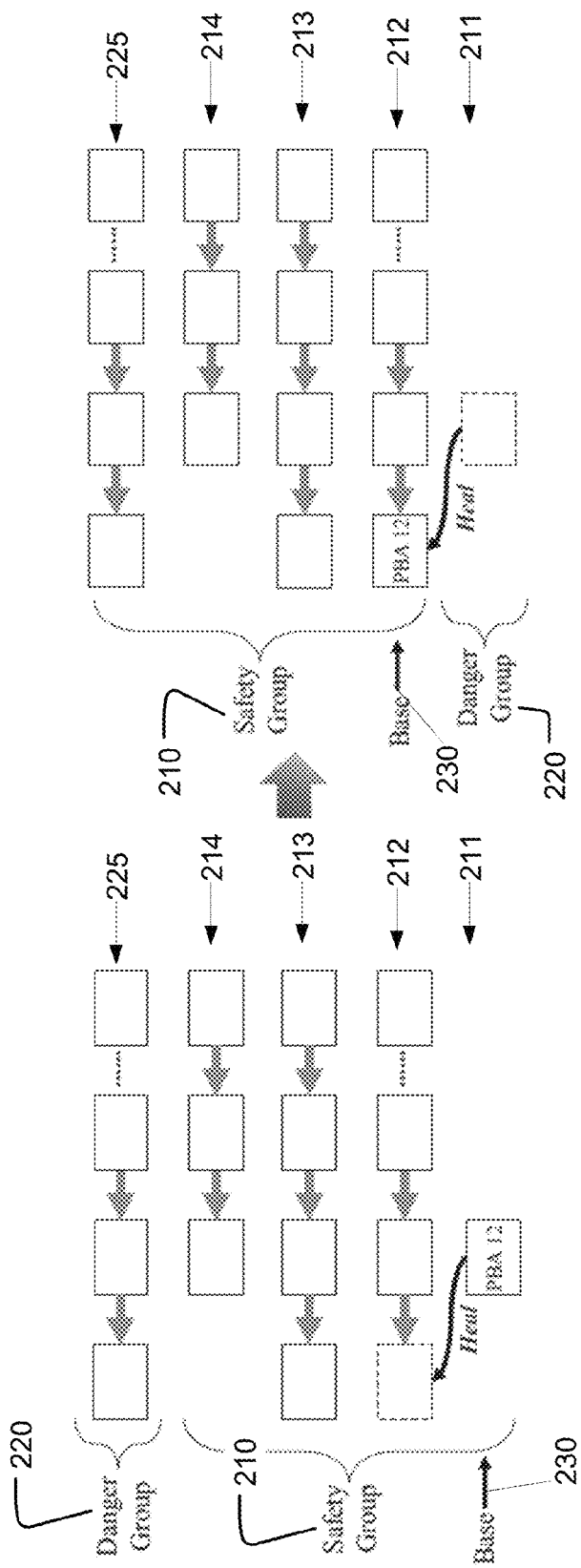
FIG. 4 illustrates an example of shifting of the danger group.

The freeze procedure reduces the likelihood of erasing the over-threshold heal count blocks. In embodiments, the freeze procedure further minimizes the heal count difference among all blocks. In embodiments, all the blocks in the healing list pointed to by the base pointer will be healed and promoted to the next healing list corresponding to blocks with an additional heal count. If the list pointed to by the base pointer is empty, the base pointer will be shifted to point to the next healing list. The healing list previously pointed to by the base pointer becomes the healing list of the danger group, and initially will be empty. The healing list previously in the danger group becomes the healing list in the safety group corresponding to the most heal counts of the healing lists in the safety group. An example of this shifting of the danger group in a circular fashion is shown in FIG. 4. In the example, the last remaining block 12, labeled PBA 12 in FIG. 4, in the healing list 211 pointed to by the base pointer 230 is healed, its heal count is incremented and the block 12 is promoted to the healing list 212 above the base pointer 230. The healing list 211 pointed to by the base pointer 230 is now empty and base pointer 230 is promoted to the next the healing list 212. The empty healing list 211 previously pointed to by the base pointer 230 now belongs to the danger group 220 and the healing list 225 previously in the danger group 220 now belongs to the safety group 210. In embodiments, the order of the healing lists does not change and the shifting of the danger group in a circular fashion causes each healing list to be pointed to by the base pointer during implementation of the technology and also causes each healing list to belong to the danger group at some time.

In embodiments, if the danger group shifts, the healing list previously in the danger group becomes the healing list corresponding to the blocks with the highest heal counts in the safety group. The healing list corresponding to the blocks with the highest heal counts in the safety group contains blocks storing data identified as dormant and moved to those blocks during a freeze procedure when the healing list belonged to the danger group. Therefore the blocks with the highest heal counts in the safety group are unlikely to be healed and promoted to the healing list of the new danger group in the near future. This shifting of the danger group therefore further reduces the probability of activation of the freeze procedure since it will take many erase cycles and resulting healing cycles before blocks are promoted to the new empty danger group by the adjustment procedure. As a result, the number of healing lists in the safety group not only affects the largest tolerated difference of the heal counts of blocks but also affects the frequency on activating the freeze procedure. The number of healing lists in the safety group therefore provides a buffering space before moving blocks into an empty danger group, so as to reduce the frequency of activating the freeze procedure.

Overhead in heal leveling technology is caused by the freeze procedure due to copying live pages in the form of copying dormant data from the safety group to the danger group. Therefore, reducing the frequency of activating the freeze procedure causes less overhead compared to wear leveling technology which has significantly more overhead caused by live page copying.

| Algorithm 1: ADJUSTMENT |
| --- |
| Input: pba, base |
| Output: |
| 1  hl ← GET-HEALINGLIST(pba); |
| 2  if IS-NEEDHEALING(pba) and (hl + N − base) % N < N−1 then |
| 3      HEAL(pba); |
| 4      REMOVE(pba); |
| 5      INSERT-HEAD(pba, (hl + 1)%N; |
| 6  else |
| 7      if (hl + N − base) % N = N − 1 then |
| 8          FREEZE(pba, base); |
| 9      else |
| 10         REMOVE(pba); |
| 11         INSERT-HEAD(pba, hl); |
| 12 if IS-EMPTY(base) then |
| 13     base ← (base + 1) % N; |

| Algorithm 2: FREEZE |
| --- |
| Input: pba, base |
| Output: |
| 1  if IS-NEEDHEALING(pba) then HEAL(pba); |
| 2  for i = 0 to N − 2 do |
| 3      hl ← (base + i) % N ; |
| 4      dormant ← GET-LISTTAILELEMENT(hl); |
| 5      While dormant ≠ NULL do |
| 6          if IS-NON-FREEBLOCK(dormant) then |
| 7              MOVETO(dormant, pba); |
| 8              REMOVE(dormant); |
| 9              INSERT-HEAD(dormant, hl); |
| 10             REMOVE(pba); |
| 11             INSERT-TAIL(pba, (base + N − 1) % N); |
| 12         break; |
| 13         dormant ← GET-LISTPREVELEMENT(dormant); |

Algorithm 1 and 2 show embodiments of the adjustment and freeze procedures. In the algorithms the following commands are used:

GET-HEALINGLIST( . . . ) returns the index of the healing list of the input block.

IS-NEEDHEALING( . . . ) returns whether or not the input block has reached a condition indicating that the input block needs to be healed. This may be done by monitoring a property of the block that may be used to indicate the heal status of the block. In embodiments, the condition may be when the block has reached its current erase count limit. In embodiments, the erase count limit may be a preset threshold or may be determined based on other factors including the heal count of the input block or how recently the input block was last erased. In embodiments, the condition may be when the bit error rate of the block has reached a bit error rate threshold. The bit error rate of a block may be detected prior to or concurrent to this command. The bit error rate of a block may be the current bit error rate, or an average over a time period. The bit error rate threshold may be a preset threshold or may be determine based on other factors including the heal count of the input block or a previous bit error rate of the input block.

HEAL( . . . ) issues the healing command for the input block.

REMOVE( . . . ) removes the input block from the healing list in which it currently belongs. In embodiments, this is done by modifying the links of a doubly linked list of the blocks linked to the input block.

INSERT-HEAD( . . . , . . . ) AND INSERT-TAIL( . . . , . . . ) modifies the input healing list to include the input block at the head or tail, respectively.

IS-EMPTY( . . . ) returns whether or not the input healing list, or healing list pointed to by the input base pointer, contains any blocks.

GET-LISTTAILELEMENT( . . . ) returns the block at the tail end of the input healing list.

IS-NON-FREEBLOCK( . . . ) returns whether or not the input block contains valid data, for example valid pages.

MOVETO(A, B) copies data stored in input block A to input block B. Input block B must be free. In embodiments, the data stored in input block A is erased.

GET_LISTPREVELEMENT( . . . ) returns the block next to the input block in the direction of the head of the list from the input block. For example, as shown in FIG. 2, if PBA 21 is the input block, this function will return PBA 22.

Algorithm 1 shows an embodiment of the adjustment procedure which is invoked in response to a block being erased. In this example pba is the block that is erased. base is the base pointer that indicates the healing list with the minimal heal count(s). (base+N−1)% N is the index of the healing list corresponding to the danger group. For example, as shown in FIG. 2, if the base pointer points to the healing list with an index of 0 and there are 5 healing lists, then the index of the healing list in the danger group is 4. However, when the base point shifts and points to the healing list with an index of 1 then the index of the danger group is 0. When the adjustment procedure in this embodiment is invoked, the residing healing list of block pba is looked up and stored as hl (Line 1). If a condition of block pba indicates block pba needs to be healed, such as reaching its erase count limit or bit error rate threshold, and block pba is not in the danger group (Line 2), the block is healed and moved to the healing list (hl+1)% N, which is the healing listing containing blocks with heal counts one higher than the healing list to which the block pba currently belongs (Lines 3-5). In the embodiment shown, there is one healing list in the danger group and N−1 healing lists in the safety group.

In the example algorithms shown, during the adjustment procedure, if block pba is in the healing list of the danger group, the freeze procedure shown in Algorithm 2 is invoked to reduce the likelihood of the block being erased or healed in the near future (Lines 7-8). Alternatively, if block pba is in a healing list in the safety group, it is moved to the head of its residing healing list hl (Lines 9-11).

After the initial portion of the adjustment procedure (Lines 1-11), if the healing list pointed to by the base pointer base is empty, the base pointer advances to the healing list corresponding to a heal count one higher than the healing list to which the base pointer currently points (Lines 12-13). This advancement of the base pointer in turn shifts the danger group to include the empty healing list previously pointed to by the base pointer. Further, the safety group now includes the healing list previously belonging to the danger group.

Algorithm 2 shows an embodiment of a freeze procedure that may be invoked when a block pba that is in the danger group is erased. When the freeze procedure is invoked by the adjustment procedure, the erased block pba is healed if there is a condition indicating the block needs healing, so that the block is prevented from being worn out before a healing command is applied (Line 1). After the block is healed, if necessary, the freeze procedure searches the healing lists in the safety group starting from the tail of the healing list pointed to by the base pointer base (Lines 2-13), where hl is the index of the currently searched healing list and dormant is the block being checked for valid data in the form of valid pages. If the block dormant is a non-free block, indicating that it contains valid pages, the search concludes (Line 6). If the block dormant is a free block, a block not containing any valid pages, the search continues to the next element in the list though the end of that list. If the healing list pointed to by the base pointer only contains free blocks not containing valid pages, the healing list corresponding to blocks with one higher heal count is searched starting from the tail end. This procedure continues to each higher healing list until a non-free block is located. The freeze procedure then moves the data from block dormant to block pba, which is followed by updating the corresponding mapping information or the physical block mapping depending on the system architecture, for example module or layer implementation, so as to reduce the possibility of erasing or healing the block pba in the near future (Line 7). Block dormant is moved to the head of its corresponding healing list since the dormant data in block dormant has been copied to the block in the danger group (Lines 8-9). In addition, block pba in the healing list in the danger group is moved to the tail of the healing list of the danger group (Lines 10-11). Further, after the transfer of data from block dormant to block pba, block dormant may be erased because it is not necessary to store the same data on two blocks.

Flow Diagram

Figure 5:
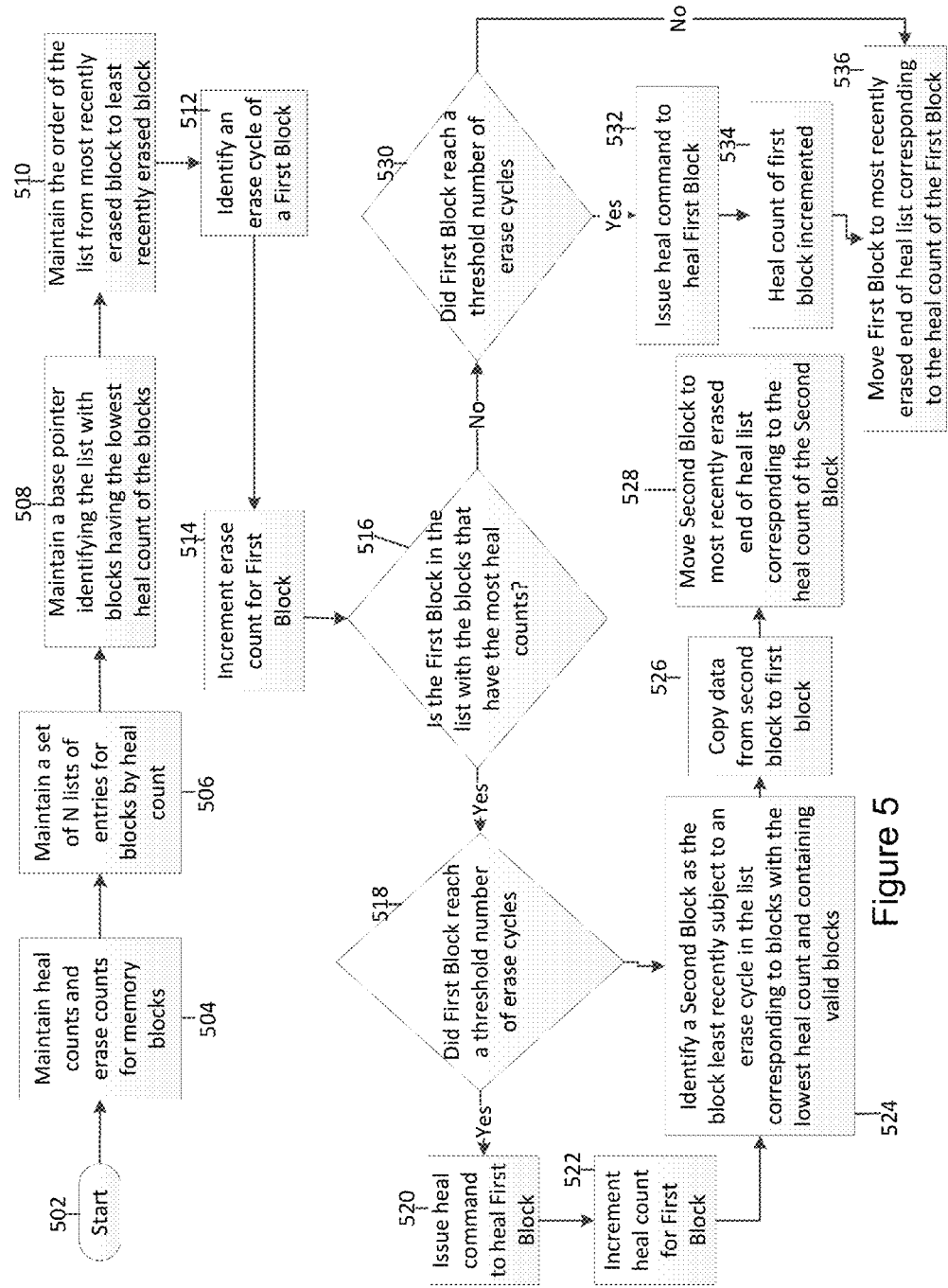
FIG. 5 illustrates an example flow diagram of the logic for the technology disclosed.

FIG. 5 is a simplified flow diagram of an embodiment of logic for the disclosed heal leveling technology. The example heal leveling logic starts 502 and begins by maintaining heal counts and erase counts for memory blocks 504. As discussed above, heal counts and erase or access counts may be stored for each block in an array. This step 504 is followed by a step 506 to maintain a set of N lists of entries for blocks by heal count. As discussed, in other embodiments there may be any number of lists, and an index of the list each block is in may be stored in an array. As previously discussed, each list may contain blocks with more than one heal count. For example, a first list may contain blocks having heal counts of 1 or 2, and a second list may contain blocks having heal counts of 3 or 4. The next step 508 is to maintain a base pointer identifying the list with blocks having the lowest heal count of the blocks. The base pointer may be stored as an array element in an array with elements for each block in a system. As discussed above, all the blocks in the healing list may be healed and promoted to the next healing list leaving the list pointed to by the base pointer empty. In this case the base pointer shifts to the next healing list. Regarding the lists, the next step 510 is to maintain the order of the list from most recently erased block to least recently erased block. As discussed above, in embodiments this may be done by the adjustment procedure which places recently erased blocks at the heads of lists, which in turn aggregates the least recently erased blocks to the tails of the lists.

Once the data structure is established, the next step 512 is to identify an erase cycle of a first block. In embodiments previously discussed, this is the beginning of the process heuristically referred to as the adjustment procedure. As established in step 504, each block has an associated erase count, and after the erase cycle of a first block is identified, the next step 514 is to increment the erase count for the first block. This step is followed by the step 516 of determining if the first block is in the list with the blocks that have the most heal counts of the blocks in the system. In embodiments discussed above, this list with the blocks that have the most heal counts is heuristically referred to as the danger group. If it is determined in step 516 that the first block is in the list with the blocks that have the most heal counts then a series of steps 518, 520, 522, 524, 526 and 528 may be performed which, in embodiments discussed above and herein, is heuristically referred to as the freeze procedure.

The first step 518 of the freeze procedure in the example logic shown is to determine if the first block has reached a threshold number of erase cycles. As discussed above this threshold may be determined based upon the heal count of the block. If the first block has reached an erase cycle threshold a heal command is issued to heal the first block 520 and the heal count of the first block is incremented by one 522. In embodiments, the heal command may be issued to heal the first block if a condition exists indicating a healing operation is needed, such as the block reaching a bit error rate threshold. The next step 524, whether the first block received a healing command or not, is to identify a second block that is the block least recently subject to an erase cycle in the list corresponding to blocks with the lowest heal count and containing valid blocks. Referring to FIG. 2 and applying the example logic from FIG. 5, PBA 30 is the first block and this step 524 starts the search with the list 211 pointed to by the base pointer 230 and identifies PBA 22 as the least recently erased valid block in the list 211 containing blocks with the lowest heal count. Note that PBA 21 and PBA 20 were erased less recently than PBA 22 but are not valid blocks. Once a second block is identified, the next step 526 is to copy data from the second block to first block. Referring again to FIG. 2, the data from the second block PBA 22 is copied to PBA 30 in the danger group. In the next step 528, the second block may be moved to the most recently erased end of the healing list corresponding to the heal count of the second block. Referring again to FIG. 2 and applying this example logic from FIG. 5, this step 528 is shown by the arrow indicating that PBA 22 is moved from the middle of the list 211 to the head.

If it is determined in step 516 that the first block is not in the list with the blocks that have the most heal counts, then a series of steps 530, 532, 534, and 536 may be performed. Steps 530, 532 and 534 are analogous to steps 518, 520, and 522 previously discussed. Once the first block is erased and does not need to be healed, the next step 536 is to move the first block to the most recently erased end of the healing list corresponding to the heal count of the first block. Referring again to FIG. 2 and applying this example logic in FIG. 5, examples of this step 536 are shown where PBA 5 is erased, does not receive a heal command and is moved to the head of its current healing list 212. Another example of this step 536 is shown where PBA 80 is erased, healed, and moved to the healing list 213 that is above the healing list 212 which previously contained the block.

Computer System

Figure 6:
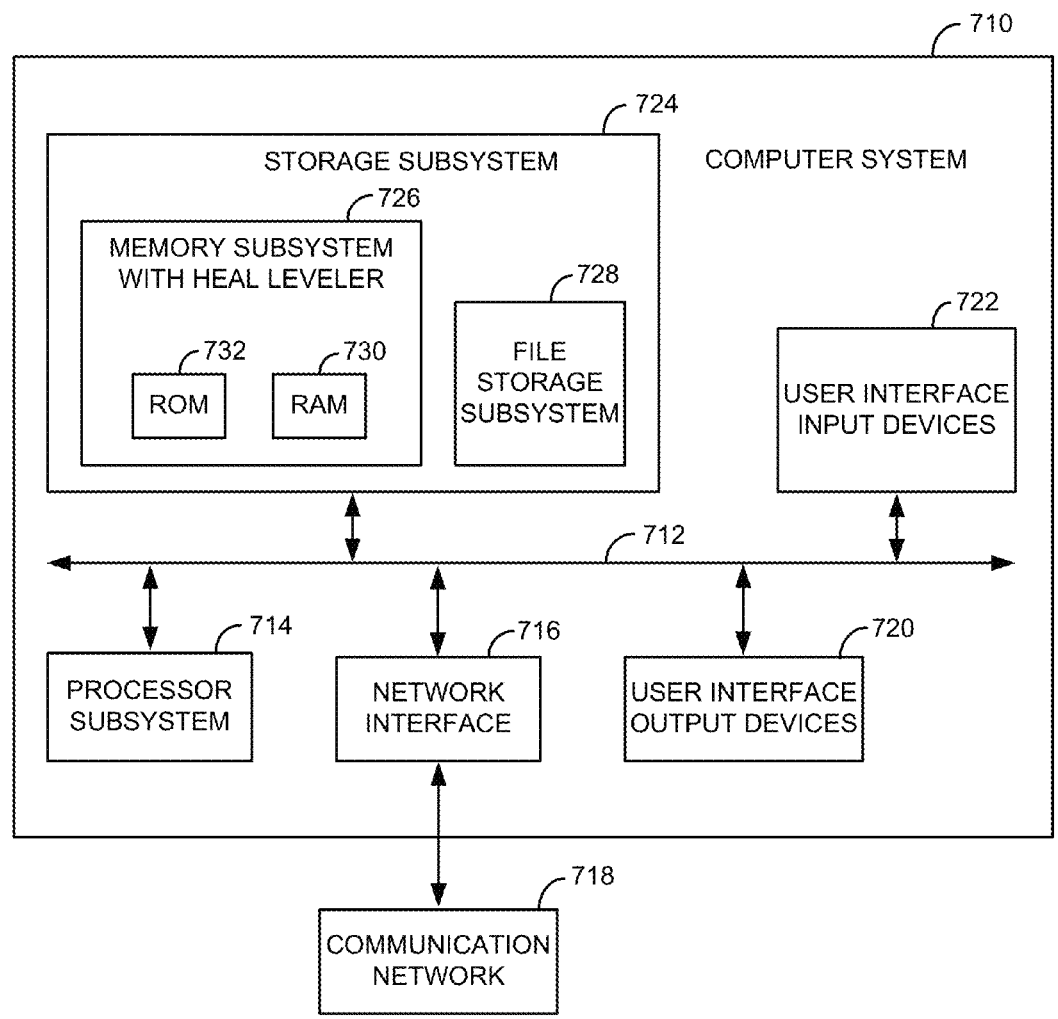
FIG. 6 is a simplified block diagram of a computer system that can be used to implement software incorporating aspects of the present invention.

FIG. 6 is a simplified block diagram of a computer system 710 that can be used to implement aspects of the present invention. In particular, the logic for heal leveling described in above embodiments may be implemented using such a computer system with hardware, software or a combination thereof.

Computer system 710 typically includes a processor subsystem 714 which communicates with a number of peripheral devices via bus subsystem 712. These peripheral devices may include a storage subsystem 724, comprising a memory subsystem with a heal-leveler 726 and a file storage subsystem 728, user interface input devices 722, user interface output devices 720, and a network interface subsystem 716. The input and output devices allow user interaction with computer system 710. Network interface subsystem 716 provides an interface to outside networks, including an interface to communication network 718, and is coupled via communication network 718 to corresponding interface devices in other computer systems. Communication network 718 may comprise many interconnected computer systems and communication links. These communication links may be wireline links, optical links, wireless links, or any other mechanisms for communication of information, but typically it is an IP-based communication network. While in one embodiment, communication network 718 is the Internet, in other embodiments, communication network 718 may be any suitable computer network.

The physical hardware components of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 722 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 710 or onto communication network 718.

User interface output devices 720 may include a display subsystem, a printer, a fax machine, or non-visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 710 to the user or to another machine or computer system.

Storage subsystem 724 stores the basic programming and data constructs that provide the functionality of certain embodiments of the present invention. For example, the various modules implementing the functionality of certain embodiments of the invention may be stored in storage subsystem 724. These software modules are generally executed by processor subsystem 714.

Memory subsystem 726 typically includes a number of memories including a main random access memory (RAM)

730 for storage of instructions and data during program execution and a read only memory (ROM) 732 in which fixed instructions are stored. Memory subsystem 726 may further include a system architecture including a heal-leveler such as shown in FIGS. 1A and 1B. File storage subsystem 728 provides persistent storage for program and data files, and may include a hard disk drive, a floppy disk drive along with associated removable media, a CD ROM drive, an optical drive, or removable media cartridges. The modules implementing the logic and functionality of certain embodiments of the invention may have been provided on a computer readable medium such as one or more CD-ROMs, and may be stored by file storage subsystem 728. The host memory 726 contains, among other things, computer instructions which, when executed by the processor subsystem 714, cause the computer system to operate or perform functions as described herein. As used herein, processes and software that are said to run in or on "the host" or "the computer," execute on the processor subsystem 714 in response to computer instructions and data in the host memory subsystem 726 including any other local or remote storage for such instructions and data.

Bus subsystem 712 provides a mechanism for letting the various components and subsystems of computer system 710 communicate with each other as intended. Although bus subsystem 712 is shown schematically as a single bus, alternative embodiments of the bus subsystem may use multiple busses.

Computer system 710 itself can be of varying types including a personal computer, a portable computer, a workstation, a computer terminal, a network computer, a television, a mainframe, a server farm, or any other data processing system or user device. Due to the ever changing nature of computers and networks, the description of computer system 710 depicted in FIG. 6 is intended only as a specific example. Many other configurations of computer system 710 are possible having more or less components than the computer system depicted in FIG. 6.

The technology disclosed increases the endurance of memory devices while reducing the write amplification caused in memory where a block must be erased before it can be rewritten. The technology disclosed further reduces live page copying, and offers better access performance, and increased effective number of written pages compared to other technologies designed to increase endurance, such as wear leveling. A further advantage of the technology is that it does not require any modification to the file-system.

The present technology is applicable to memories with lifetime limitations including phase change memory, flash memory, magnetic random access memory, and resistive random access memory. The present technology can be implemented in computer hardware, software, or firmware.

While the present invention is disclosed by reference to the preferred embodiments and examples detailed above, it is to be understood that these examples are intended in an illustrative rather than a limiting sense. It is contemplated that modification and combinations will readily occur to those skilled in the art, which modifications and combinations will be within the spirit of the invention and the scope of the following claims.

What is claimed is:

1. A method for operating a memory device having a plurality of memory blocks, comprising:
   maintaining heal counts for memory blocks in the plurality of memory blocks;
   in combination with an access cycle of a first block having a first heal count, finding a second block having a second heal count lower than the first heal count, and causing the data from the second block to be copied to the first block.

2. The method of claim 1, including maintaining access cycle counts for memory blocks in the plurality of memory blocks, issuing heal commands to the memory device for blocks reaching a threshold number of access cycles, and incrementing the heal counts.

3. The method of claim 2, wherein the memory is flash memory, and the access cycles are erase cycles.

4. The method of claim 1, including monitoring heal status indicator values for memory blocks in the plurality of memory blocks, issuing heal commands to the memory device for blocks reaching a threshold heal status indicator value, and incrementing the heal counts.

5. The method of claim 1, wherein said finding a second block includes selecting a least recently cleared block as said second block from a number of blocks with said second heal count.

6. The method of claim 1, including maintaining a data structure classifying blocks in the plurality of blocks by heal count.

7. The method of claim 1, including maintaining a set of lists of entries for blocks in the plurality of blocks, assigning heal count thresholds to the linked lists in the set, and inserting entries for the blocks into the linked lists in the set according to the heal counts of the blocks and the heal count thresholds.

8. The method of claim 7, wherein the set of lists includes a number N members, where N is greater than 2, and maintaining a base pointer identifying a starting list in the set having a starting heal count threshold, and wherein other lists in the set are addressable by corresponding offsets 1 to N−1 (modulo N) from the base pointer.

9. The method of claim 8, including identifying the first block having the first heal count by detecting an access cycle for a block in a list in the set having offset N−1 (modulo N) from the base pointer.

10. The method of claim 8, wherein if the list pointed to by the base pointer becomes empty, incrementing the base pointer modulo N.

11. The method of claim 8, including ordering the lists to identify blocks in the respective lists least recently subject of an access cycle, and wherein said finding the second block includes identifying the block identified as least recently subject of an access cycle in the list with the lowest index having a valid block.

12. The method of claim 11, wherein the lists in the set are linked lists, having the block least recently subject of an access cycle at an end of the linked list.

13. A system comprising:
   memory including a plurality of memory blocks, the memory being configured for heal cycles;
   a processor coupled to the memory, including logic to:
      maintain heal counts for memory blocks in the plurality of memory blocks;
      in combination with an access cycle of a first block having a first heal count, find a second block having a second heal count lower than the first heal count, and cause the data from the second block to be copied to the first block.

14. The system of claim 13, wherein the processor includes logic to maintain access cycle counts for memory blocks in the plurality of memory blocks, issue heal commands to the memory device for blocks reaching a threshold number of access cycles, and increment the heal counts.

15. The system of claim 14, wherein the memory is flash memory, and the access cycles are erase cycles.

16. The system of claim 13, wherein the processor includes logic to monitor heal status indicator values for memory blocks in the plurality of memory blocks, issue heal commands to the memory device for blocks reaching a threshold heal status indicator value, and increment the heal counts.

17. The system of claim 13, wherein said logic to find a second block includes logic to select a least recently cleared block as said second block from a number of blocks with said second heal count.

18. The system of claim 13, wherein the processor includes logic to maintain a data structure classifying blocks in the plurality of blocks by heal count.

19. The system of claim 13, wherein the processor includes logic to maintain a set of lists of entries for blocks in the plurality of blocks, assign heal count thresholds to the linked lists in the set, and insert entries for the blocks into the linked lists in the set according to the heal counts of the blocks and the heal count thresholds.

20. The system of claim 19, wherein the set of lists includes a number N members, where N is greater than 2, and wherein the processor includes logic to maintain a base pointer identifying a starting list in the set having a starting heal count threshold, and wherein other lists in the set are addressable by corresponding offsets 1 to N−1 (modulo N) from the base pointer.

21. The system of claim 20, wherein the processor includes logic to identify the first block having the first heal count by detecting an access cycle for a block in a list in the set having offset N−1 (modulo N) from the base pointer.

22. The system of claim 20, wherein the processor includes logic to increment the base pointer modulo N wherein if the list pointed to by the base pointer becomes empty.

23. The system of claim 20, wherein the processor includes logic to order the lists to identify blocks in the respective lists least recently subject of an access cycle, and wherein said logic to find the second block includes logic to identify the block identified as least recently subject of an access cycle in the list with the lowest index having a valid block.

24. The system of claim 23, wherein the lists in the set are linked lists, having the block least recently subject of an access cycle at an end of the linked list.

\* \* \* \* \*